United States Patent
Imbornone et al.

(10) Patent No.: US 6,850,747 B1
(45) Date of Patent: Feb. 1, 2005

(54) IMAGE TRAP FILTER

(75) Inventors: James F. Imbornone, Methuen, MA (US); Jean-Marc Mourant, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 09/608,763

(22) Filed: Jun. 30, 2000

(51) Int. Cl.[7] .............................................. H04B 1/18
(52) U.S. Cl. ..................... 455/302; 455/302; 455/307; 455/501; 348/729; 348/736
(58) Field of Search .......................... 455/302, 182.3, 455/191.1, 193.2, 197, 250.1, 251, 340, 501, 303, 306, 307, 286, 266; 348/729, 731, 736

(56) References Cited

U.S. PATENT DOCUMENTS

| | | | | |
|---|---|---|---|---|
| 4,276,573 A | * | 6/1981 | Halpern et al. | 360/45 |
| 4,479,249 A | | 10/1984 | Geesen et al. | |
| 4,479,255 A | | 10/1984 | Geesen et al. | |
| 4,484,356 A | | 11/1984 | Geesen et al. | |
| 4,500,854 A | * | 2/1985 | Meyer | 331/117 R |
| 4,831,661 A | * | 5/1989 | Suzuki | 455/302 |
| 4,835,608 A | * | 5/1989 | Lachiw et al. | 348/733 |
| 5,428,828 A | * | 6/1995 | Pugel et al. | 455/191.2 |
| 5,539,359 A | * | 7/1996 | Goma | 331/117 D |
| 5,697,092 A | | 12/1997 | Mourant et al. | |
| 5,742,897 A | * | 4/1998 | Plowdrey et al. | 455/142 |
| 5,886,589 A | | 3/1999 | Mourant | |
| 5,963,842 A | * | 10/1999 | Kinugawa | 725/68 |
| 6,021,056 A | | 2/2000 | Forbes et al. | |
| 6,137,376 A | | 10/2000 | Imbornone et al. | |
| 6,222,399 B1 | | 4/2001 | Imfornone et al. | |
| 6,313,712 B1 | | 11/2001 | Mourant et al. | |
| 6,342,813 B1 | | 1/2002 | Imbornone et al. | |
| 6,380,821 B1 | | 4/2002 | Imbornone et al. | |
| 6,396,362 B1 | | 5/2002 | Mourant et al. | |
| 6,432,812 B1 | | 8/2002 | May | |
| 6,529,719 B1 | | 3/2003 | Imbornone et al. | |
| 6,687,494 B1 | | 2/2004 | Mourant | |
| 2001/0050598 A1 | | 12/2001 | Mourant et al. | |

FOREIGN PATENT DOCUMENTS

DE            0608815 A1 * 8/1994 ............ H03D/7/18

* cited by examiner

*Primary Examiner*—William Trost
*Assistant Examiner*—Stephen D'Agosta
(74) *Attorney, Agent, or Firm*—Ratner & Prestia; Joseph P. Abate

(57) ABSTRACT

An image trap filter disposed between the low noise amplifier and the mixer of a radio frequency receiver that overcomes the adverse effect of process variations on image signal rejection for both a single-band radio frequency receiver and a multi-band radio frequency receiver by setting the image trap filter response at the center of the band of interest at production test. The image signal problem is presented at the input of the radio frequency receiver and the image trap filter is adjusted for the desired frequency response.

8 Claims, 5 Drawing Sheets

IMAGE TRAP FILTER

TECHNICAL FIELD

The present invention relates, in general, to the rejection of the image signal of a radio frequency signal converted to an intermediate frequency and, in particular, to a frequency conversion mixer especially suited to be implemented on an integrated circuit.

BACKGROUND OF THE INVENTION

Unlike wireline communications, the wireless environment accommodates essentially an unlimited number of users sharing different parts of the frequency spectrum and very strong signals coexist next to very weak signals. A radio receiver must be able to select the signal of interest, while rejecting all others.

Among the important problems faced by the designers of radio receivers are image rejection and monolithic integration. A radio receiver must be able to select the desired signal from its image. Otherwise, the subsequent detector circuit will be unable to distinguish between the desired signal and the image signal and, therefore, the output will be the result of the superposition of both. As wireless communications units evolve, means to reduce cost, size, and weight through monolithic integration are critical.

Image signal rejection relates to the ability of the radio frequency receiver to select the desired signal from the image signal of the desired signal spaced away by twice the intermediate frequency signal. This is important as the subsequent detector circuit will be unable to distinguish between the desired signals and the image signals and, therefore, the output of the detector circuit will be the result of the superposition of both. This is the essence of the image signal problem.

In conventional heterodyne receiver architectures, a large and expensive ceramic or Surface Acoustic Wave (SAW) filter is positioned between the low noise amplifier and the mixer to suppress the image signal. This arrangement is attractive in terms of current consumption. The arrangement defies integration, however, and results in excessive size, weight, and cost.

There also have been efforts to use phasing methods to achieve image signal rejection in the mixer itself. U.S. Pat. No. 5,870,670 and U.S. Pat. No. 5,678,220 provide examples of such efforts. Image reject mixers in which phasing methods are used are at best, however, only capable of achieving 30 dB of image rejection over the typical temperatures and processes used. The limitation, in terms of reliable image rejection from the phasing methods, comes from the required amplitude and phase imbalance in the local oscillator quadrature generation and intermediate frequency quadrature combining. It can be shown mathematically that achieving even 30 dB of image rejection using the phasing method requires less than 1° and 0.5 dB of phase and amplitude balance, respectively. The phasing methods of achieving image rejection, while improvements in terms of integration and cost, require additional filtering to meet overall system image rejection.

Other attempts at image rejection have involved image "traps" in the form of a simple series inductance-capacitance (or "L-C") circuit across the differential line. This approach results in an excess inductance in the desired band that must be tuned out. Traditionally, a series capacitor has been used to tune out the in-band inductance. This approach suffers, however, from the fact that an additional mixer DC return is required. An on-chip choke, to provide this DC return, would be large and have considerable DC resistance. The increased space requirements add expense and the increased DC resistance in the ground return path lowers the voltage headroom on the mixer limiting its dynamic range.

U.S. Pat. No. 5,630,225 describes an arrangement by which a dielectric member is placed in proximity to a transmission line. The electromagnetic properties of this member alter the frequency response characteristic of the system by the formation of a notch at the image signal frequency. Such an arrangement is not amenable to monolithic integration. The dielectric member does not have the requisite electrical characteristics for such an application and the physical size of the dielectric member makes it unsuitable for monolithic integration.

FIG. 1 is a schematic drawing of a portion of a prior art radio frequency receiver. In FIG. 1, a radio frequency signal is received by a low noise amplifier 10 and, after amplification, is supplied to an image trap filter 12 that filters the image signal from the amplified radio frequency signal. The radio frequency signal then is supplied to a mixer 14 that develops the intermediate frequency signal from the radio frequency signal.

In modern radio frequency receivers for wireless applications, typically 50 dB of image signal filtering is required from the overall system. This image signal filtering comes from a combination of pre-select band pass filtering, image filtering and possible use of an image reject mixer. This high image signal rejection requirement means that the contribution of each portion of the receiver, where image signal rejection takes place, to the overall image signal rejection is critical.

In addition, in a multi-band radio frequency receiver, the image signal filter must pass all the radio frequency signal bands and must reject all the image signals simultaneously. A fundamental problem in designing an image signal filter for a multi-band radio frequency receiver is that a higher order image signal filter (i.e., a higher number of poles in the filter response) is required. This is illustrated by FIG. 2.

Furthermore, problems arise when there is degradation in image signal rejection in an image trap filter due to process variations (i.e., variations in the values of components, such as resistors, capacitors and inductors, in the image trap filter). The possible variations of component values used to construct a monolithic filter requires significant margins in the image signal rejection response of an image signal filter.

SUMMARY OF THE INVENTION

To overcome the shortcomings of the prior ways of achieving image signal rejection with an image trap filter considered above, a new image trap filter is provided by the present invention. One object of the present invention is to provide a new and improved image trap filter. Another object of the present invention is to provide a new and improved radio frequency receiver. A further object of the present invention is to provide a new and improved image trap filter that is particularly suited for implementation in an integrated circuit.

An image trap filter for filtering an image signal from a radio frequency signal, constructed in accordance with the present invention, includes a first branch having an inductor and a capacitor connected in series. At least one of the inductor and the capacitor are tunable. This image trap filter also includes a second branch connected in parallel with the first branch and has a tunable impedance. An image trap filter for filtering an image signal from a radio frequency signal, constructed in accordance with the present invention, further includes means for tuning at least one of the inductor and the capacitor in the first branch and the impedance in said second branch to resonate the first branch at the frequency of the image signal and present in the first branch at the frequency of the image signal a low impedance, present in the first branch an impedance at the frequency of the radio frequency signal, and resonate the second branch with the first branch to present a high impedance at the radio frequency.

It will be understood that both the foregoing general description of the invention and the following detailed description of the invention are exemplary, but are not restrictive of the invention.

BRIEF DESCRIPTION OF THE DRAWINGS

The present invention is best understood from the following detailed description when read in conjunction with the accompanying drawing. Included in the drawing are the following figures.

DETAILED DESCRIPTION OF THE INVENTION

Figure 1:
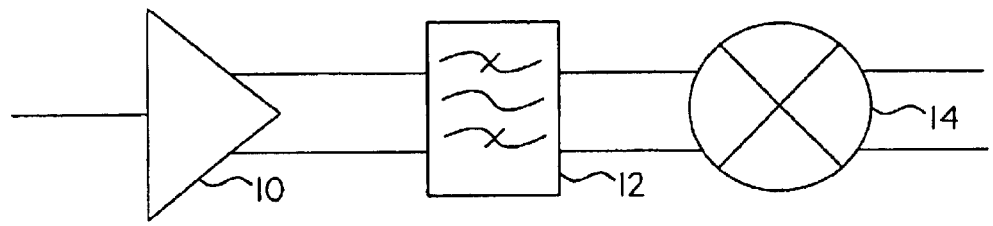
FIG. 1 is a schematic drawing of a portion of a prior art radio frequency receiver.
Figure 2:
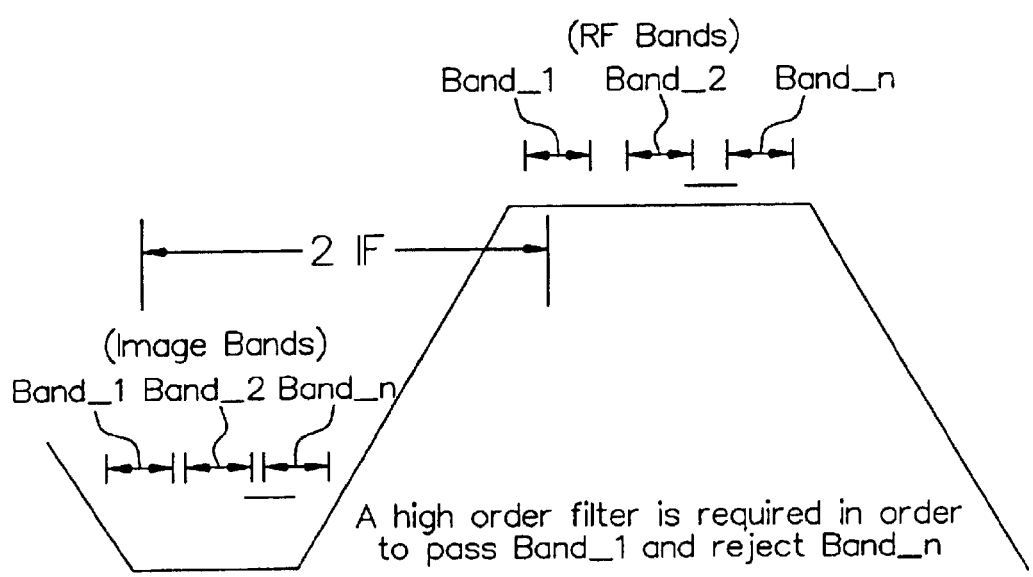
FIG. 2 is a frequency response curve that represents the conventional approach for designing an image signal filter for a multi-band radio frequency receiver.
Figure 3:
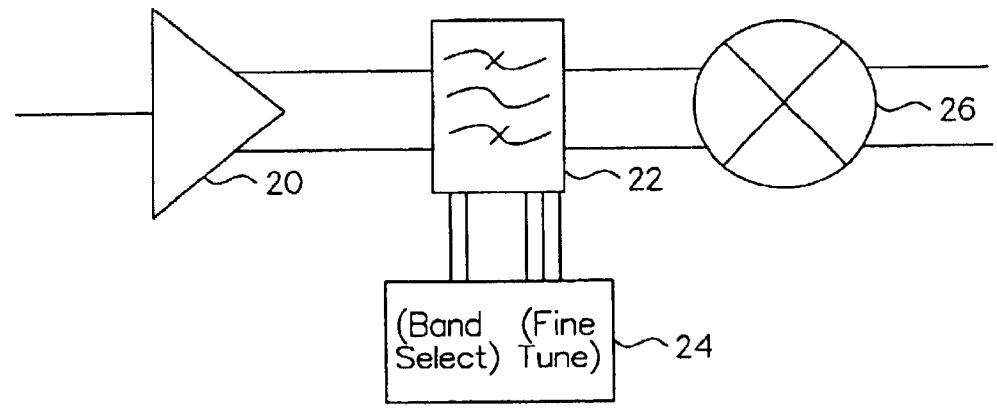
FIG. 3 is a schematic drawing of a portion of a radio frequency receiver that incorporates an image trap filter constructed in accordance with the present invention.

FIG. 3 is a schematic drawing of a portion of a radio frequency receiver that incorporates an image trap filter constructed in accordance with the present invention. In FIG. 3, a radio frequency signal is received by a low noise amplifier 20 and, after amplification, is supplied to an image trap filter 22 constructed in accordance with the present invention. Image trap filter is tunable by means represented by block 24 to select a band when incorporated in a multi-band radio frequency receiver and to filter the image signal from the amplified radio frequency signal. The radio frequency signal then is supplied to a mixer 26 that develops the intermediate frequency signal from the radio frequency signal.

Figure 4:
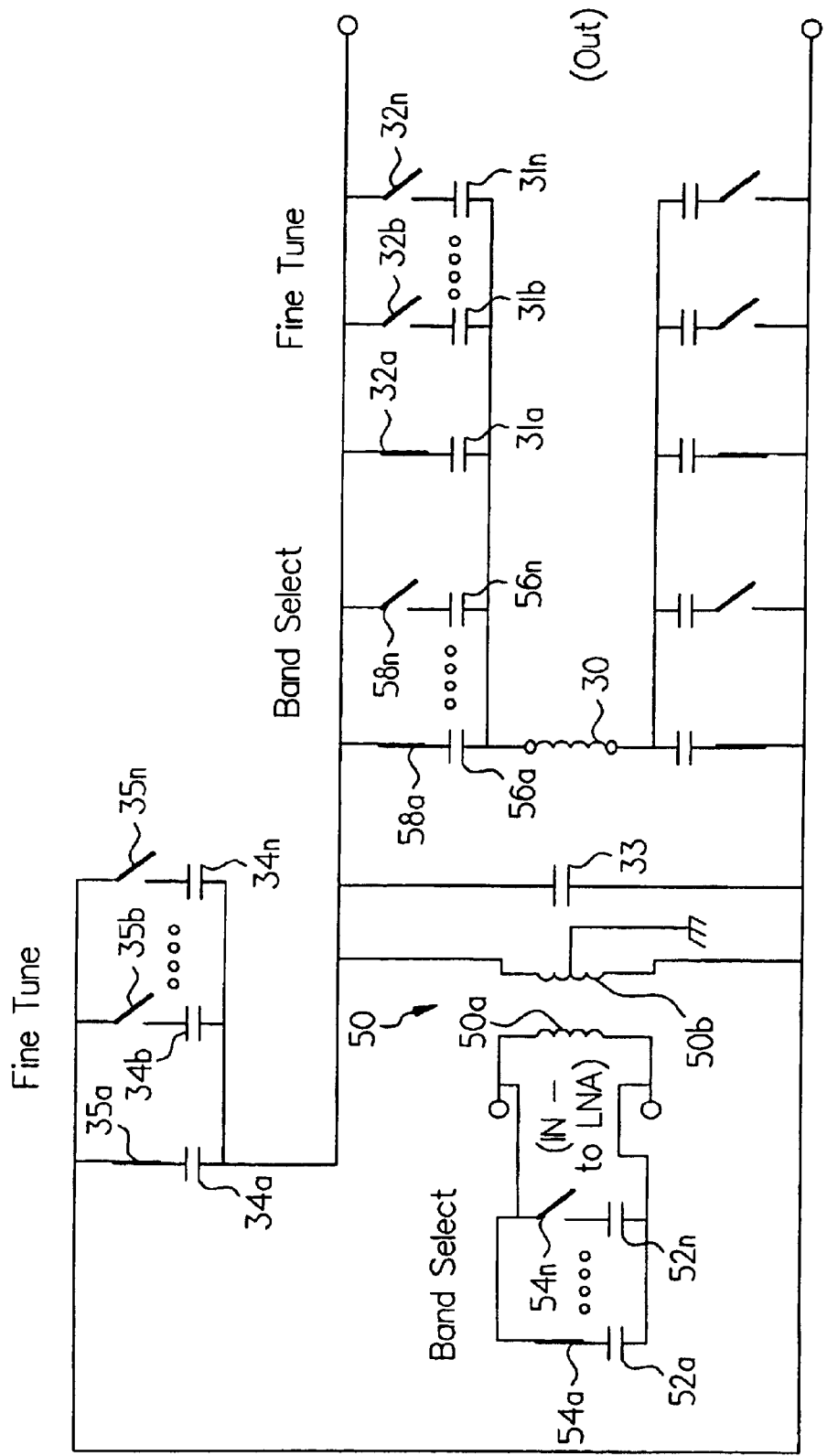
FIG. 4 is a circuit diagram of an image trap filter, constructed in accordance with the present invention, with ideal switches.

Referring to FIG. 4, an image trap filter for filtering an image signal from a radio frequency signal, constructed in accordance with a first embodiment of the present invention and arranged for low-side injection of the local oscillator frequency, includes a first branch having an inductor 30 and a capacitor made up of a plurality of capacitors 31a, 31b . . . 31n that are connected in series with inductor 30. As such, the capacitor in the first branch is tunable by the selective closing of a plurality of switches 32a, 32b . . . 32n individually connected in series with capacitors 31a, 31b . . . 31n.

An image trap filter for filtering an image signal from a radio frequency signal, constructed in accordance with the present invention, also includes a second branch connected in parallel with the first branch and having a tunable impedance, namely a capacitor 33. Connected across capacitor 33 is a second set of capacitors 34a, 34b . . . 34n and a second set of switches 35a, 35b . . . 35n individually connected in series with capacitors 34a, 34b . . . 34n. This arrangement makes the impedance in the second branch, namely a capacitance, tunable.

Tuning of the two branches of the image trap filter of FIG. 4 is done during assembly of the radio frequency receiver to overcome potential degradation in image signal rejection in an image trap filter due to process variations (i.e., variations in the values of components, such as resistors, capacitors and inductors, in the image trap filter). The tuning is such as to cause the first branch to resonate at the frequency of the image signal, the first branch to present a low impedance at the frequency of the image signal, the first branch to present an inductive impedance at the frequency of the radio frequency signal, and the second branch to resonate with the first branch to present a high impedance at the radio frequency.

Figure 6A:
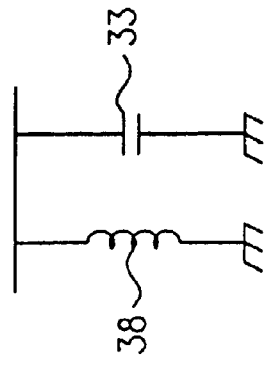
FIG. 6A is a simplified circuit diagram of the FIG. 4 circuit for low-side injection of the local oscillator frequency.
Figure 6B:
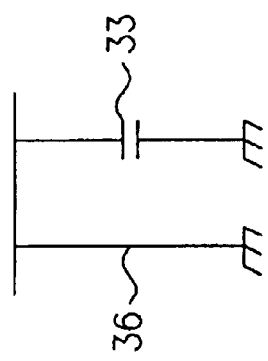
FIG. 6B is a circuit diagram of the functional equivalent circuit of FIG. 4 for low-side injection of the local oscillator frequency at the frequency of the image signal.
Figure 6C:
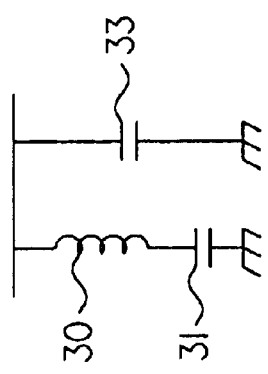
FIG. 6C is a circuit diagram of the functional equivalent circuit of FIG. 4 for low-side injection of the local oscillator frequency at the frequency of the radio frequency signal that contains the image signal.

FIG. 6A is a simplified circuit diagram of the FIG. 4 circuit for low-side injection of the local oscillator frequency. FIG. 6B is a circuit diagram of the functional equivalent circuit of FIG. 4 at the frequency of the image signal. FIG. 6C is a circuit diagram of the functional equivalent circuit of FIG. 4 at the frequency of the radio frequency signal that contains the image signal. The short-circuit 36 in the first branch in FIG. 6B represents the low impedance at the frequency of the image signal and the inductor 38 in the first branch in FIG. 6C represents an inductive impedance at the frequency of the radio frequency signal. Capacitor 33 in the second branch resonates with the first branch, namely the inductive impedance of the inductor 38 to present a high impedance at the frequency of the radio frequency signal.

For high-side injection of the local oscillator frequency, the image trap filter of FIG. 4 includes a capacitor instead of inductor 30, two sets of inductors instead of the two sets of capacitors 31a, 31b . . . 31n and 34a, 34b . . . 34n, and an inductor instead of capacitor 33.

Figure 7A:
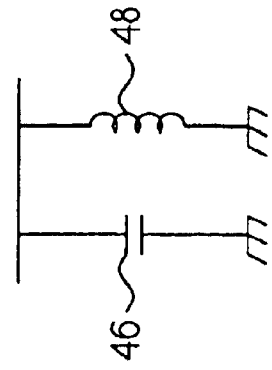
FIG. 7A is a simplified circuit diagram of the FIG. 4 circuit for high-side injection of the local oscillator frequency.
Figure 7B:
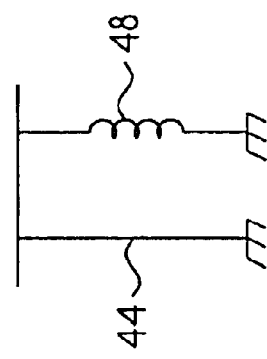
FIG. 7B is a circuit diagram of the functional equivalent circuit of FIG. 4 for high-side injection of the local oscillator frequency at the frequency of the image signal.
Figure 7C:
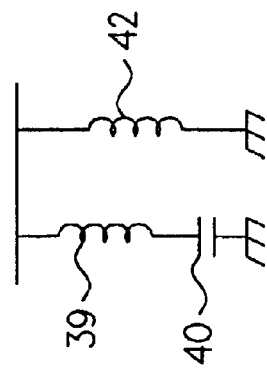
FIG. 7C is a circuit diagram of the functional equivalent circuit of FIG. 4 for high-side injection of the local oscillator frequency at the frequency of the radio frequency signal that contains the image signal.

FIG. 7A is a simplified circuit diagram of the FIG. 4 circuit for high-side injection of the local oscillator frequency. A tunable inductor 39 is connected in series with a capacitor 40 in a first branch that is connected in parallel with a second branch having an inductor 42. FIG. 7B is a circuit diagram of the functional equivalent circuit of FIG. 4 at the frequency of the image signal for high-side injection of the local oscillator frequency. FIG. 7C is a circuit diagram of the functional equivalent circuit of FIG. 4 at the frequency of the radio frequency signal that contains the image signal for high-side injection of the local oscillator frequency. The short-circuit 44 in the first branch in FIG. 7B represents the low impedance at the frequency of the image signal and the capacitor 46 in the first branch in FIG. 7C represents a capacitive impedance at the frequency of the radio frequency signal. Inductor 48 in the second branch resonates with the first branch, namely the capacitive impedance of capacitor 46 to present a high impedance at the frequency of the radio frequency signal.

An image trap filter, constructed in accordance with the present invention, lends itself to balanced architectures as illustrated by FIG. 4, which are required for highly integrated radio frequency integrated circuit receivers due to isolation concerns.

As indicated above, an image trap filter, constructed in accordance with the present invention, can be incorporated in a multi-band radio frequency receiver. In such a case, as shown on FIG. 4, the image trap filter further includes a transformer 50 of conventional construction and operation and having a primary winding 50a and a secondary winding 50b. For the embodiment of the invention being described, secondary winding 50b is a center-tapped, grounded winding. Primary winding 50a is connected to a low noise amplifier.

When incorporated in a multi-band radio frequency receiver, an image trap filter, constructed in accordance with the present invention, further includes a first band select filter coupled to primary winding 50a of transformer 50 and a second band select filter coupled to that one of the inductor and the capacitor in the first branch that is tunable, namely the capacitor made up of capacitors 31a, 31b . . . 31n for the embodiment of the invention illustrated by FIG. 4. The first band select filter that is coupled across primary winding 50a includes a plurality of capacitors 52a . . . 52n individually connected in series with a plurality of switches 54a . . . 54n. The second band select filter that is coupled to capacitor 33 also includes a plurality of capacitors 56a . . . 56n individually connected in series with a plurality of switches 58a . . . 58n.

Figure 8:
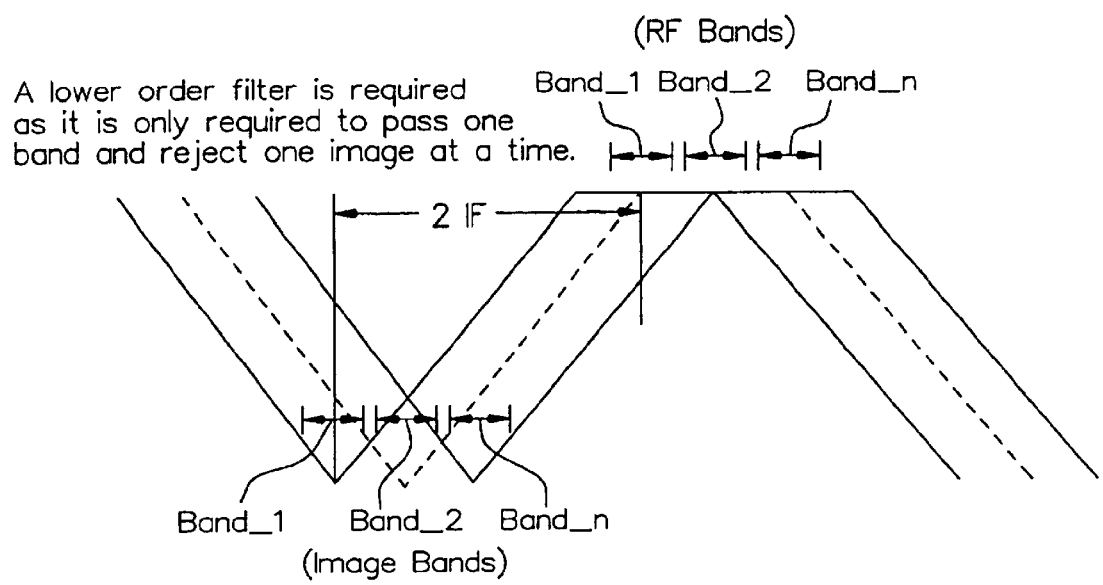
FIG. 8 is RF Band and Image Band diagram of the image trap filter during use.
Figure 9:
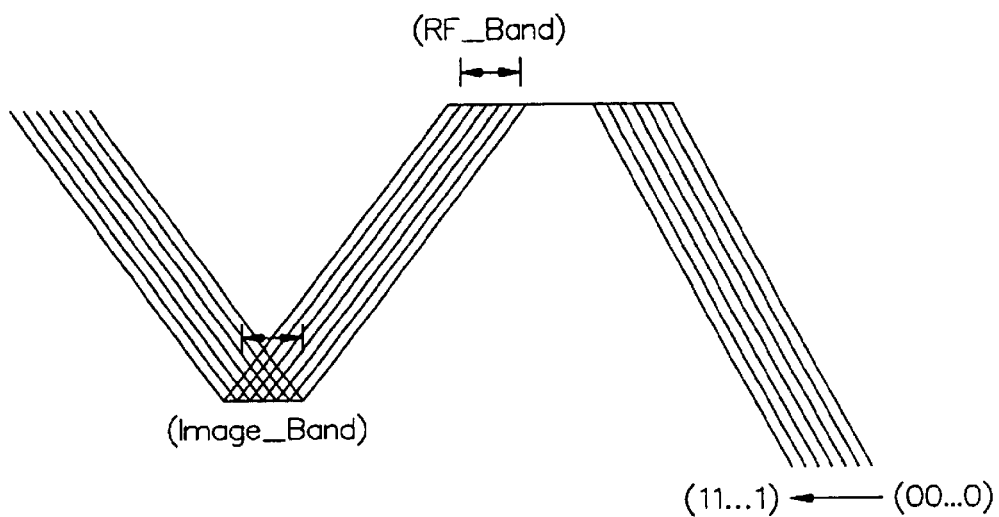
FIG. 9 is an RF Band and Image Band diagram for fine tuning of the image trap filter during receiver assembly.

In use, upon reception of a radio frequency signal by the radio frequency receiver, the appropriate switches in the first band select filter and the second band select filter, corresponding to the band containing the frequency of the radio frequency signal, are closed and the receiver is conditioned to receive and process the radio frequency signal. This is shown by FIG. 8. FIG. 9 shows the fine tuning of the image trap filter done during assembly of the radio frequency receiver to avoid degradation of the image signal rejection due to process variations for a multi-band radio frequency receiver.

Figure 5:
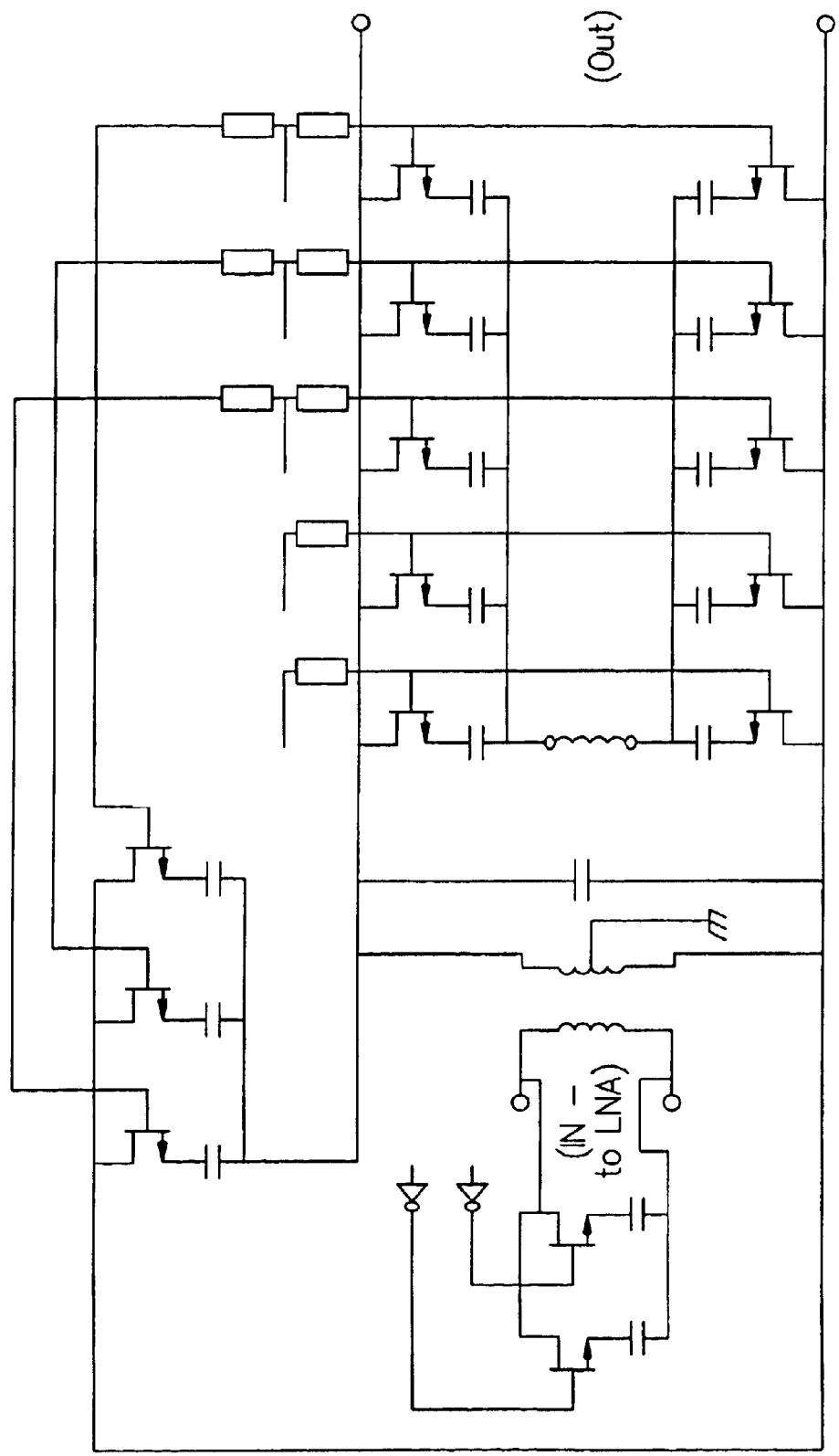
FIG. 5 is a circuit diagram of an image trap filter, constructed in accordance with the present invention, with MOSFET switches.

In FIG. 4, the switches by which the image trap filter selects a band and tunes to avoid degradation of the image signal rejection due to process variations are shown as ideal switches. FIG. 5 is a circuit diagram of an image trap filter, constructed in accordance with the present invention, with MOSFET switches.

Although illustrated and described above with reference to certain specific embodiments, the present invention nevertheless is not intended to be limited to the details shown. Rather, various modifications may be made in the details within the scope and range of equivalents of the claims and without departing from the spirit of the invention.

What is claimed is:

1. An image trap filter for filtering an image signal from a radio frequency signal, said image trap filter comprising:
   a first branch having an inductor and a capacitor connected in series, at least one of said inductor and said capacitor being tunable;
   a second branch connected in parallel with said first branch and having a tunable impedance; and
   means for tuning;
   (a) at least one of said inductor and said capacitor in said first branch, and
   (b) said impedance in said second branch
   to:
   (a) resonate said first branch at the frequency of the image signal and present in said first branch at the frequency of the image signal a low impedance,
   (b) present in said first branch an impedance at the frequency of the radio frequency signal, and
   (c) resonate said second branch with said first branch to present a high impedance at the radio frequency; wherein
   (i) said impedance presented in said first branch at the frequency of the radio frequency is inductive, said impedance in said second branch is capacitive,
   (ii) said capacitor in said first branch is tunable and includes a plurality of capacitors, and
   (iii) said tuning means includes a plurality of switches individually connected in series with said plurality of capacitors that are selectively closed.

2. An image trap fitter for filtering an image signal from a radio frequency signal, said image trap filter comprising:
   a first branch having an inductor and a capacitor connected in series, at least one of said inductor and said capacitor being tunable;
   a second branch connected in parallel with said first branch and having a tunable impedance; and
   means for tuning:
   (a) at least one of said inductor and said capacitor in said first branch, and
   (b) said impedance in said second branch
   to:
   (a) resonate said first branch at the frequency of the image signal and present in said first branch at the frequency of the image signal a low impedance,
   (b) present in said first branch an impedance at the frequency of the radio frequency signal, and
   (c) resonate said second branch with said first branch to present a high impedance at the radio frequency; wherein
   (i) said impedance presented in said first branch at the frequency of the radio frequency is capacitive,
   (ii) said impedance in said second branch is inductive,
   (ii) said inductor in said first branch is tunable and includes a plurality of inductors, and
   (iv) said tuning means includes a plurality of switches individually connected in series with said plurality of inductors that are selectively closed.

3. An image trap filter for a multi-band radio frequency receiver for selecting a radio frequency band and filtering an image signal from a radio frequency signal within the selected radio frequency band, said image trap filter comprising:

a transformer having primary winding and a secondary winding;

a first band select filter coupled to said primary winding of said transformer;

a first branch coupled to said secondary of said transformer and having an inductor and a capacitor connected in series, at least one of said inductor and said capacitor being tunable;

a second branch coupled to said secondary of said transformer and connected in parallel with said first branch and having a tunable impedance, and means for tuning:
 (a) at least one of said inductor and said capacitor in said first branch, and
 (b) said impedance in said second branch to:
 (a) resonate said first branch at the frequency of the image signal and present in said first branch at the frequency of the image signal a low impedance,
 (b) present in said first branch an impedance at the frequency of the radio frequency signal, and
 (c) resonate said second branch with said first branch to present a high impedance at the radio frequency;

a second band select filter coupled to that one of said inductor and said capacitor in said first branch that is tunable; wherein
 (i) said impedance presented in said first branch at the frequency of the radio frequency signal is inductive,
 (ii) said impedance in said second branch is capacitive,
 (iii) said capacitor in said first branch is tunable and includes a plurality of capacitors, and
 (iv) said tuning means includes a plurality of switches individually connected in series with said plurality of capacitors that are selectively closed.

4. An image trap filter for a multi-band radio frequency receiver for selecting a radio frequency band and filtering an image signal from a radio frequency signal within the selected radio frequency band, said image trap filter comprising:

a transformer having a primary winding and a secondary winding;

a first band select filter coupled to said primary winding of said transformer;

a first branch coupled to said secondary of said transformer and having an inductor and a capacitor connected in series, at least one of said inductor and said capacitor being tunable;

a second branch coupled to said secondary of said transformer and connected in parallel with said first branch and having a tunable impedance, and means for tuning:
 (a) at least one of said inductor and said capacitor in said first branch, and
 (b) said impedance in said second branch to:
 (a) resonate said first branch at the frequency of the image signal and present in said first branch at the frequency of the image signal a low impedance,
 (b) present in said first branch an impedance at the frequency of the radio frequency signal, and
 (c) resonate said second branch with said first branch to present a high impedance at the radio frequency;

a second band select filter coupled to that one of said inductor and said capacitor in said first branch that is tunable; wherein
 (i) said impedance presented in said first branch at the frequency of the radio frequency signal is capacitive,
 (ii) said impedance in said second branch is inductive,
 (iii) said inductor in said first branch is tunable and includes a plurality of inductors, and
 (iv) said tuning means includes a plurality of switches individually connected in series with said plurality of inductors that are selectively closed.

5. A radio frequency receiver, comprising:

means for receiving a radio frequency signal;

a low noise amplifier for amplifying said radio frequency signal;

an image trap filter for filtering an image signal from said radio frequency signal and having:
 (a) a first branch having an inductor and a capacitor connected in series, at least one of said inductor and said capacitor being tunable;
 (b) a second branch connected in parallel with said first branch and having a tunable impedance; and
 (c) means for tuning:
  (1) at least one of said inductor and said capacitor in said first branch, and
  (2) said impedance in said second branch
 to:
  (1) resonate said first branch at the frequency of the image signal and present in said first branch at the frequency of the image signal a low impedance,
  (2) present in said first branch an impedance at the frequency of the radio frequency signal, and
  (3) resonate said second branch with said first branch to present a high impedance at the radio frequency;

a local oscillator;

a mixer responsive to said local oscillator and the output of said image trap filter for developing an intermediate frequency signal; and an intermediate frequency amplifier for amplifying said intermediate frequency output signal; wherein
 (i) said impedance presented in said first branch at the frequency of the radio frequency signal is inductive,
 (ii) said impedance in said second branch is capacitive,
 (iii) said capacitor in said first branch is tunable and includes a plurality of capacitors, and
 (iv) said tuning means includes a plurality of switches individually connected in series with said plurality of capacitors that are selectively closed.

6. A radio frequency receiver, comprising:

means for receiving a radio frequency signal;

a low noise amplifier for amplifying said radio frequency signal;

an image trap filter for filtering an image signal from said radio frequency signal and having;
 (a) first branch having an inductor and a capacitor connected in series, at least one of said inductor and said capacitor being tunable;
 (b) a second branch connected in parallel with said first branch and having a tunable impedance; and
 (a) means for tuning:
  (1) at least one of said inductor and said capacitor in said first branch, and
  (2) said impedance in said second branch
 to:
  (1) resonate said first branch at the frequency of the image signal and present in said first branch at the frequency of the image signal a low impedance,
  (2) present in said first branch an impedance at the frequency of the radio frequency signal, and (3) resonate said second branch with said first branch to present a high impedance at the radio frequency;

a local oscillator;

a mixer responsive to said local oscillator and the output of said image trap filter for developing an intermediate frequency signal; and an intermediate frequency amplifier for amplifying said intermediate frequency output signal; wherein
  (i) said impedance presented in said first branch at the frequency of the radio frequency signal is capacitive,
  (ii) said impedance in said second branch is inductive,
  (iii) said inductor in said first branch is tunable and includes a plurality of inductors, and
  (iv) said tuning means includes a plurality of switches individually connected in series with said plurality of inductors that are selectively closed.

7. A radio frequency receiver, comprising:

means for receiving a radio frequency signal;

a low noise amplifier for amplifying said radio frequency signal;

an image trap filter for filtering an image trap signal from said radio frequency signal and having;
  (a) a transformer having a primary winding and a secondary winding;
  (b) a first band select filter coupled to said primary winding of said transformer;
  (c) a first branch coupled to said secondary of said transformer and having an inductor and a capacitor connected in series, at least one of said inductor and said capacitor being tunable;
  (d) a second branch coupled to said secondary of said transformer and connected in parallel with said first branch and having a tunable impedance; and
  (e) means for tuning:
    (1) at least one of said inductor and said capacitor in said first branch, and
    (2) said impedance in said second branch
  to:
    (1) resonate said first branch at the frequency of the image signal and present in said first branch at the frequency of the image signal a low impedance,
    (2) present in said first branch an impedance at the frequency of the radio frequency signal, and
    (3) resonate said second branch with said first branch to present a high impedance at the radio frequency;
  (f) a second band select filter coupled to that one of said inductor and said capacitor in said first branch that is tunable;

a local oscillator;

a mixer responsive to said local oscillator and the output of said image trap filter for developing an intermediate frequency signal; and an intermediate frequency amplifier for amplifying said intermediate frequency output signal; wherein
  (i) said impedance presented in said first branch at the frequency of the radio signal is inductive,
  (ii) said impedance is said second branch is capacitive,
  (iii) said capacitor in said first branch is tunable and includes a plurality of capacitors, and
  (iv) said tuning means includes a plurality of switches individually connected in series with said plurality of capacitors that are selectively closed.

8. A radio frequency receiver, comprising:

means for receiving a radio frequency signal;

a low noise amplifier for amplifying said radio frequency signal;

an image trap filter for filtering an image trap signal from said radio frequency signal and having;
  (a) a transformer having a primary winding and a secondary winding;
  (b) a first band select filter coupled to said primary winding of said transformer;
  (c) a first branch coupled to said secondary of said transformer and having an inductor and a capacitor connected in series, at least one of said inductor and said capacitor being tunable;
  (d) a second branch coupled to said secondary of said transformer and connected in parallel with said first branch and having a tunable impedance; and
  (e) means for tuning:
    (1) at least one of said inductor and said capacitor in said first branch, and
    (2) said impedance in said second branch
  to:
    (1) resonate said first branch at the frequency of the image signal and present in said first branch at the frequency of the image signal a low impedance,
    (2) present in said first branch an impedance at the frequency of the radio frequency signal, and
    (3) resonate said second branch with said first branch to present a high impedance at the radio frequency;
  (f) a second band select filter coupled to that one of said inductor and said capacitor in said first branch that is tunable;

a local oscillator:

a mixer responsive to said local oscillator and the output of said image trap filter for developing an intermediate frequency signal; and an intermediate frequency amplifier for amplifying said intermediate frequency output signal; wherein
  (i) said impedance presented in said first branch at the frequency of the radio signal is inductive,
  (ii) said impedance is said second branch is capacitive,
  (iii) said inductor in said first branch is tunable and includes a plurality of inductors, and
  (iv) said tuning means includes a plurality of switches individually connected in series with said plurality of inductors that are selectively closed.

* * * * *